United States Patent [19]

Forsberg

[11] Patent Number: 5,083,094

[45] Date of Patent: Jan. 21, 1992

[54] SELECTIVE POWER COMBINER USING PHASE SHIFTERS

[75] Inventor: Bjorn G. Forsberg, Los Altos, Calif.

[73] Assignee: Space Systems/Loral, Inc., Palo Alto, Calif.

[21] Appl. No.: 590,192

[22] Filed: Sep. 28, 1990

[51] Int. Cl.[5] .............................................. H03F 3/68
[52] U.S. Cl. ............................ 330/124 R; 330/124 D
[58] Field of Search ............. 330/51, 53, 107, 124 D, 330/124 R, 286, 295, 302; 333/101, 117

[56] References Cited

U.S. PATENT DOCUMENTS

| 4,016,503 | 4/1977 | Rambo | 330/124 D |
|---|---|---|---|
| 4,311,965 | 1/1982 | Jones | 330/124 R |
| 4,315,222 | 2/1982 | Saleh | 330/124 D |
| 4,477,781 | 10/1984 | Reuss, Jr. | 330/286 |
| 4,549,152 | 10/1985 | Kumar | 330/124 R X |
| 4,618,831 | 10/1986 | Egami et al. | 330/124 R |
| 4,755,769 | 7/1988 | Katz | 330/295 |
| 4,841,262 | 6/1989 | Lomangino | 333/117 X |

FOREIGN PATENT DOCUMENTS 0136945  11/1978  Japan ............................ 330/124 D

*Primary Examiner*—Steven Mottola
*Attorney, Agent, or Firm*—John S. Ferrell; Edward J. Radlo

[57] ABSTRACT

A circuit for selecting and combining power signals of a pair of parallel amplifiers (3,4) using phase shifters (5,6) having fixed phase. Either amplifier (3,4) may be selected to produce a power signal of power P at the circuit output (9), where P is the power at the output (11,12) of each amplifier (3,4). Alternatively, power from the two amplifiers (3,4) may be combined to produce a signal of power 2P at the circuit output (9). By using a passive circuit to achieve the selection and combination, the use of heavier and less reliable relay switches is avoided.

11 Claims, 1 Drawing Sheet

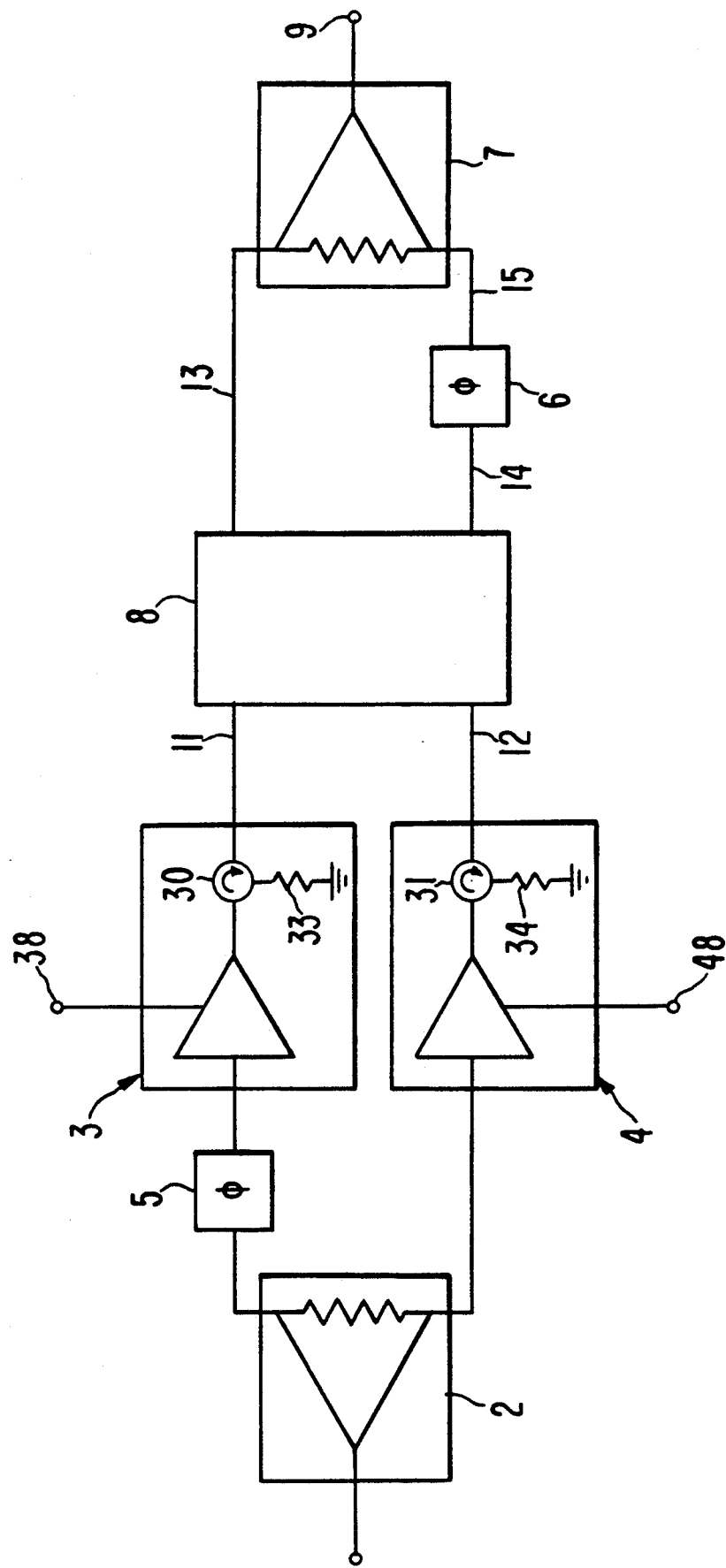

SELECTIVE POWER COMBINER USING PHASE SHIFTERS

TECHNICAL FIELD

This invention relates to the selection or combination of power in electronic circuits, and more particularly to the selection of various power levels using two parallel amplifiers and passive phase shifting circuitry.

BACKGROUND ART

U.S. Pat. No. 4,755,769 is directed to a power transmitter and conversion circuit for selecting output power from one or more of a plurality of power amplifiers. The patent uses shorting electromechanical switches and does not disclose the use of phase shifters to vary the output power.

U.S. Pat. No. 4,016,503 discloses an amplifier network which improves reliability through automatic passive switching between two parallel circuits, while providing a constant level of output power. The output power of the reference circuit is equal to only one-half the power of either of the two amplifiers. The summing of power levels of the constituent amplifiers is not disclosed.

U.S. Pat. No. 4,311,965 discloses a power switching technique for a multi-module amplifier where one or more modules may be disconnected without affecting the performance of the other modules. In a low power mode, a large amount of amplifier power is dissipated in the combining circuit. No use of phase shifting to facilitate switching is disclosed.

The instant invention is directed to the use of two parallel power amplifiers, such that the amplifiers may be used individually or in combination to increase the output power signal. The transmission and combination of signals is effected using phase mixing, thereby avoiding the weight and reliability problems of switches. None of the prior art now known and described above, either alone or in combination, solves these problems.

DISCLOSURE OF INVENTION

The present invention is a circuit for the selection and combination of power amplifiers (3, 4). The circuit contains a first phase shifter (5) having an input and output terminal, the output terminal of which couples to a first power amplifier (3). The output of the first amplifier (3) couples to the first input (11) of a 180° 3dB hybrid coupler (8). A second amplifier (4) couples to the second input (12) of the hybrid (8). The hybrid (8) has a pair of first and second hybrid outputs (13, 14), wherein the second hybrid output (14) is coupled to the input of a second phase shifter (6). An output power combiner (7) joins the hybrid first output (13) and the output of the second phase shifter (6) into a common output terminal (9).

BRIEF DESCRIPTION OF THE DRAWING

FIG. 1 is a block diagram showing a preferred embodiment of the present invention.

BEST MODE FOR CARRYING OUT THE INVENTION

On present day satellites and other spacecraft, significant importance is placed on components having light weight, high reliability and small size. Since spacecraft cannot generally be repaired once deployed, redundant systems are often used to improve reliability. In such a redundant amplifier system, two amplifiers might be used in order to maintain high reliability. A main amplifier acts as the primary circuit, with an identical backup amplifier available to act as a replacement should a malfunction or failure in the main amplifier occur. In addition to the two amplifiers themselves, a means of switching between the two amplifiers during a failure must also be included. This switching has traditionally been performed in power systems through the use of relays. Relays have the disadvantages for space-flight applications of being somewhat unreliable, relatively bulky, and heavy.

In addition to the reliability issue, there are many applications which require the ability to select and combine amplifiers depending on the output power requirements of the system. An example is a system having a primary operating mode where two identical amplifiers having ten watts of power each are combined to produce a total of twenty watts of output power In a secondary operating mode, it may be desirable (to save power) or necessary (because one of the amplifiers has failed) to operate the same system using only a single ten watt amplifier. Optimally, it would be desirable to be able to operate in the ten watt mode using either of the two ten watt amplifiers.

In the preferred embodiment of the instant invention, phase shifters and a hybrid coupler are used to replace the heavier and less reliable electromechanical switches that have traditionally been employed in the construction of power combining networks used in space flight applications. Although the invention disclosed is not frequency limited or specific, the preferred embodiment is optimized for operation in the microwave frequency range, i.e., frequencies equal to or greater than 1 GHz.

With reference to FIG. 1, an r.f. power signal is applied to the input of power splitter 2, which distributes substantially equal power to first phase shifter 5 and second power amplifier 4. The input splitter 2 is of conventional construction, suitable for dividing microwave power signals without introducing a phase shift between the two divided splitter 2 output signals. Power amplifier 3 is fed by first phase shifter 5, which is of conventional construction and introduces a fixed phase shift of $-180°$ to r.f. signals within the frequency range of interest. Power amplifiers 3, 4 feed the first and second hybrid inputs 11, 12, respectively, of a 180°, 3dB hybrid power coupler 8. Hybrid coupler 8 introduces phase lag, separating the signals passing through it by 180°. Hybrid 8 works on the basis that the phase of the signal at port 12 is replicated at first output 13, and the phase of the signal at port 11 is replicated at port 14. Second hybrid output 14 couples to the input of a second phase shifter 6. The output of phase shifter 6 and the first output terminal 13 of hybrid 8 are coupled through a non-phase shifting power combiner 7, having an output 9, which is the output of the overall circuit.

The power amplifiers 3, 4 in this circuit each have substantially equal gain and phase shift and delivers an output power substantially equal to P and have the characteristic of being individually switchable between ON and OFF. The switching of amplifiers 3, 4 is done via control terminals 38 and 48, respectively, which may be activated from a location remote to the circuit, e.g., an Earth terminal in the case where the circuit is on board a spacecraft. An internal circulator 30, 31 at the output of each amplifier 3, 4 provides equivalent output impedance loads 33, 34 when the associated amplifier 3, 4 is not operating. This provides for the correct terminating impedances for hybrid 8 in the case amplifier 3, 4 is not operating.

In operation, the power at circuit output 9 can be selectively provided from either the first or second amplifiers 3, 4; or the output power 9 can be doubled by utilizing both amplifiers 3, 4 simultaneously, as summarized in Table 1.

the same relative phase shift but not the same absolute phase shift, because the amplifier 3 power has been shifted 180° while the amplifier 4 power has not. Phase the power at port 14 by −180° so the relative shifter 6 shifts the power at port 14 by −180° so the relative phase at 15 is 0°, the same as port 13. These two coherent signals are combined in power combiner 7 and the combined power will be produced at output 9.

| | CIRCUIT POWER AND PHASE RELATIONSHIPS | | | | | |
|---|---|---|---|---|---|---|
| | Power and Phase at the Indicated Terminal | | | | | |
| Amplifier Status | 11 | 12 | 13 | 14 | 15 | 9 |
| Amplifier 3 ON Amplifier 4 OFF | $P_3$ at −180° | 0 (terminated in 34) | $XP_3$ at 0° | $XP_3$ at −180° | $XP_3$ at 0° | P |
| Amplifier 3 OFF Amplifier 4 ON | 0, (terminated in in 33) | $P_4$ at 0° | $XP_4$ at 0° | $XP_4$ at −180° | $XP_4$ at 0° | P |
| Amplifier 3 ON Amplifier 4 ON | $P_3$ at −180° | $P_4$ at 0° | $XP_3$ at 0° $XP_4$ at 0° | $XP_3$ at −180° $XP_4$ at −180° | $XP_3$ at 0° $XP_4$ at 0° | 2P 2P |

All phases in reference to input of divider 2, without account for (substantially equal) inherent phase delays in amplifiers 3,4, and circuit implementation.

In the use of this invention for space flight operations, the amplifiers 3, 4 might be controlled using command transmissions from the ground. In this way, ground control can selected between amplifiers 3, 4 or combine amplifiers 3, 4 to boost power output. If it is necessary or desirable to use power just from the first amplifier 3, the first amplifier 3 is switched ON and the second amplifier 4 is switched OFF. Power enters the first hybrid input port 11 and appears at the two hybrid output ports 13, 14 with one-half of the input power at each port 13, 14. The second output port 14 power lags the first output 13 power in phase by 180°. With the second amplifier 4 switched OFF, port 12 is terminated into resistor 34 through the second amplifier 4 circulator. The second phase shifter 6 provides a fixed −180° phase shift for the power from port 14, resulting in 0° (−360°) relative phase shift at output terminal 15. This is the same phase as port 13 provides. These signals are then summed by power combiner 7, producing an output power at circuit output 9 substantially equivalent to that at the output 9 of the first amplifier 3.

Conversely, if it is necessary or desirable to use power just from the second amplifier 4, the second amplifier 4 is switched ON and the first amplifier 3 is switched OFF. Power P enters the second hybrid input 12 from the second amplifier 4. Port 11 of hybrid 8 terminates to ground through resistor 33 in the output circulator 30 of the first amplifier 3. The power is split in hybrid 8 such that ½ P is present at each of hybrid output terminals 13 and 14, separated in phase by 180°, with the power at terminal 14 180° behind that at terminal 13. Power from the second hybrid output 14 is shifted an additional −180° by the second phase shifter 6. As a result of the phase change imparted by the second phase shifter 6, the power signals at the input of the power combiner 7 are in-phase (0° phase differential) and combine at the output terminal 9 to produce a power signal equal to P.

Twice the first or second amplifier power can be produced at the output 9 by turning both amplifiers 3, 4 ON. The power from power splitter 2 to the first amplifier 3 is shifted −180° in phase by the first phase shifter 5. Half of the first amplifier 3 power appears at ports 13 and 14 with 0° phase at 13, and −180° phase at 14 (both referenced to the input 2 phase). Half of the second amplifier 4 power also appears at ports 13 and 14 with The above description is included to illustrate the operation of the preferred embodiments and is not meant to limit the scope of the invention. The scope of the invention is to be delimited only by the following claims. From the above discussion, many variations will be apparent to one skilled in the art that would yet be encompassed by the spirit and scope of the invention.

For example, phase shifter 5 can be move to before amplifier 4 or after either amplifier 3 or 4 without affecting overall circuit function. All that matters is that the signal from one of amplifiers 3 and 4 is shifted by 180°. Phase shifter 6 can be moved to be between port 13 and power combiner 7 without affecting overall circuit function. All that matters is that the signal on one of terminals 13 and 14 is shifted by 180°.

I claim:

1. A circuit for the selection and combination of power amplifiers, said circuit comprising:
   first and second power amplifiers each having an input terminal and an output terminal;
   coupled to said amplifiers, means for shifting the signal appearing at one of the two output terminals by 180°;
   a 180° 3dB hybrid coupler having first and second inputs respectively coupled to the output terminals of the first and second power amplifiers, and having first and second outputs;
   a first 180° phase shifter, having an input and an output, the input of which is coupled to one of the two outputs of the hybrid coupler; and
   an output power combiner having first and second inputs and a single output at which appears the output power of the circuit, wherein the inputs of the output power combiner are respectively coupled to the output of the 180° phase shifter and the output of the hybrid coupler that is not coupled to the input of the 180° phase shifter.

2. The circuit of claim 1 further comprising an input power splitter having an input and first and second outputs; wherein:
   the shifting means comprises a second 180° phase shifter having an input and an output, the output of which is coupled to the input terminal of the first power amplifier;

the outputs of the input power splitter are respectively coupled to the input of the second phase shifter and the input terminal of the second power amplifier;

a power signal is applied to the input terminal of the input power splitter; and the input power splitter equally distributes the power signal such that two output signals of substantially equal magnitude and substantially equal phase are produced on the first and second outputs of the input power splitter.

3. The circuit of claim 1 wherein each power amplifier further comprises a control terminal which allows the amplifier to be switched ON and OFF in response to a control signal applied thereto.

4. The circuit of claim 3 wherein said control signal is sent to said control terminal from a location remote to said circuit.

5. The circuit of claim 1 wherein the first and second power amplifiers have substantially equal gain and phase characteristics.

6. The circuit of claim 1 wherein a circulator is interposed between the output terminal of each power amplifier and the respective input of the hybrid coupler, each circulator providing the corresponding amplifier with a characteristic output terminal impedance when the amplifier is disabled.

7. The circuit of claim 1 wherein the first power amplifier is turned ON, and the second power amplifier is turned OFF; whereby the output power of the circuit is substantially equal to the power at the output terminal of the first power amplifier.

8. The circuit of claim 1 wherein the first power amplifier is turned OFF, and the second power amplifier is turned ON; whereby the output power of the circuit is substantially equal to the power at the output terminal of the second power amplifier.

9. The circuit of claim 1 wherein the first and second amplifiers are actuated; whereby the output power of the circuit is substantially equal to the sum of the powers appearing at the output terminals of the first and second amplifiers.

10. A method for selecting and combining a pair of power amplifiers, said method comprising the steps of:

splitting a power signal between two parallel paths to produce two input signals;

selectively amplifying at least one of the input signals to achieve a desired output power level;

3dB hybrid coupling the amplified input signals at 180° to produce two output signals;

phase shifting by 180° exactly one of the two output signals; and combining the output signal thus phase-shifted with the non-phase-shifted output signal.

11. The method of claim 10 further comprising the additional step of phase shifting by 180° one of the two input signals prior to selectively amplifying it.

* * * * *